US005497540A

United States Patent [19]

Venkataraman et al.

[11] Patent Number: 5,497,540

[45] Date of Patent: Mar. 12, 1996

[54] METHOD FOR FABRICATING HIGH DENSITY ULTRASOUND ARRAY

[75] Inventors: Subramaniam Venkataramani, Clifton Park; Robert F. Kwasnick; Peter W. Lorraine, both of Niskayuna, all of N.Y.

[73] Assignee: General Electric Company, Schenectady, N.Y.

[21] Appl. No.: 362,338

[22] Filed: Dec. 22, 1994

[51] Int. Cl.$^6$ .................................................. H01L 41/22

[52] U.S. Cl. .................................... 29/25.35; 128/662.03

[58] Field of Search ...................... 128/662.03; 310/332, 310/325, 326, 327, 363, 364, 365; 73/632, 641; 29/25.35, DIG. 1, DIG. 55

[56] References Cited

U.S. PATENT DOCUMENTS 4,939,826 7/1990 Shoup .................................... 29/23.35

5,423,220 6/1995 Finsterwald et al. ...................... 73/642

OTHER PUBLICATIONS

Jeffry W. Stevenson et al., "Fabrication and Characterization of PZT/Thermoplastic Polymer Composites for High–Frequency Phased Linear Arrays," Presented at the 95th Annual Meeting of the American Ceramic Society, Cincinnati, OH, Apr. 20, 1993.

Jeffry W. Stevenson et al., "Fabrication and Characterization of PZT/Thermoplastic Polymer Composites for High–Frequency Phased Linear Arrays," J. Amer. Ceram. Soc. 77 (9) pp. 2481–2484, 1994.

*Primary Examiner*—George Manuel

*Attorney, Agent, or Firm*—Donald S. Ingraham; Marvin Snyder

[57] ABSTRACT

A high yield method of fabricating an ultrasound array having densely packed ultrasound elements with smooth surface finishes includes the steps of: 1) applying an acoustic matching material to opposites faces (or surfaces) of a piezo electric material ceramic block; 2) cutting the block in a plane perpendicular to the two faces of the block so as to form a plurality of wafers having the acoustic matching material disposed on opposite ends; 3) assembling the wafers to form a laminated body having respective portions of the matching layer on opposite surfaces and with the wafers each being separated from an adjacent wafer by a selected gap distance and bonded together by a polymeric adhesive material; 4) cutting the laminated body along a longitudinal axis so as to form a first laminate body subassembly and a second laminate body subassembly, each of the subassemblies having a front surface having the acoustic matching material disposed thereon and a back surface where the laminate body was cut; 5) applying a backing layer to each laminate body subassembly; and 6) removing the polymeric adhesive material disposed between the wafers, whereby each subassembly comprises an ultrasound array having transducer elements separated by the selected array gap distance.

13 Claims, 5 Drawing Sheets

METHOD FOR FABRICATING HIGH DENSITY ULTRASOUND ARRAY

BACKGROUND OF THE INVENTION

Piezoelectric transducer/detector arrays used in medical imaging comprise a number of transducers (typically 64 or more transducers) that are independently controlled to operate as a phased array. The phased array structure of such an ultrasound device allows the focusing of the ultrasound beam over a wide area of the body and retrieval of output signal from a large volume of the body. The resolution provided by an ultrasound array is a function of several factors, including the center frequency of the array, the bandwidth of the individual elements, the number of elements and their positions. A typical phased array design consists of multiple elements with their centers spaced by nor more than half the center frequency sound wavelength. Optimum performance requires good acoustic isolation between individual elements; such isolation is typically achieved by cutting (with a saw) material between the elements. It is, however, desirable to minimize the width of the isolation cuts in order to maximize the active area of the array. For example, the desirable spacing between elements in an array having a 7.5 MHz center frequency is about 100 μm (0.1 mm) to avoid off-axis grating lobes which can decrease image contrast and resolution. Performance of the array is also enhanced when the transducer elements have a smooth finish.

Improvements in resolution are being sought from the use of higher frequencies (e.g., about 10 MHz to about 15 MHz) and an increased number of densely-packed transducers (e.g, in the range between about 128 to 256). Fabrication of high density arrays requires many steps of high precision and has proven to be difficult, time consuming, and expensive. For example, in one common fabrication method, a plate (or block) of piezoelectric ceramic material is diced part way through with a diamond saw or the like. Many precise saw cuts are necessary to define the individual elements in the array, which is a lengthy process. Other difficulties with this method of fabrication include the low physical strength of the array (the depth of the saw cuts affecting the structural integrity of ceramic block) and the size of the area separating respective elements being limited by the shape and thickness of the saw (most saws being of a size that the distance between array elements is greater than 25 μm). The surface of the transducer elements formed by the cuts is typically rough, with variations in the surface plane of greater than 5%. Further, yield from such processes is low in light of the fact that one improper saw cut typically destroys the usefulness of the whole array.

Another method of array fabrication is disclosed in U.S. Pat. No. 4,939,826. In this method, a piezoelectric material is polished and cut to a desired size and then cut into small wafers. The wafers are placed in an assembly fixture to be stacked and bonded together. After application of backing material, the device is removed from the assembly fixture and some of the bonding material is removed from between the individual wafers. This process calls for precisely sizing the ceramic block at the beginning of the process, with the block being processed to produce one set of wafers for an array. Further, the nature of this process results in the handling of a very small workpieces for the majority of the processing in the construction of an ultrasound array; such work with small pieces is both tedious and susceptible to causing damage to array components, resulting in a reduced yield from the manufacturing process.

One object of the present invention is to provide a high yield method of fabricating a high density ultrasound array. Such an array typically includes a large number of transducer elements that have smooth finishes and has spacing between transducer elements of less than 25 microns.

SUMMARY OF THE INVENTION

In accordance with this invention, a high yield method of fabricating an ultrasound array having densely packed ultrasound elements with smooth surface finishes includes the steps of: 1) applying an acoustic matching material to opposites faces (or surfaces) of a piezo electric material ceramic block; 2) cutting the block in a plane perpendicular to the two faces of the block so as to form a plurality of wafers having the acoustic matching material disposed on opposite ends; 3) assembling the wafers to form a laminated body, the wafers being aligned such that the respective ends with the acoustic matching material are aligned, the wafers each being separated from an adjacent wafer by a selected gap distance and bonded together by a polymeric adhesive material; 4) cutting the laminated body along a longitudinal axis so as to form a first laminate body subassembly and a second laminate body subassembly, each of the subassemblies having a respective front surface having the acoustic matching material disposed thereon and a respective back surface where the laminate body was cut; 5) applying a backing layer to the back surface of each laminate body subassembly; and 6) removing the polymeric adhesive material disposed between the wafers, whereby each subassembly comprises an ultrasound array having transducer elements separated by the selected array gap distance. Additionally, conductive material for electrode contacts is typically disposed on the ceramic material, for example, on the ceramic block surface on which the acoustic matching layer is to be applied, and on the end of the wafers to which the backing layer is bonded.

The polymeric adhesive material is chosen so that it can be removed by vaporizing or dissolving it in a process that does not adversely affect other bonds between the piezoelectric ceramic material and other components of the array, such as the backing layer.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

The method of the present invention provides a high yield and high through-put process for fabricating a high resolution ultrasound array in which the transducer elements are densely packed (that is, having gaps between respective elements of 25 μm or less) and that have smooth surface finishes. One measure of a "high yield" process is the "finished ratio", that is, the number of finished arrays that work (as defined by design criteria) versus the total number of arrays fabricated; an alternative measure of yield is the "begun ratio", which refers to the number of arrays begun that work when fabrication is complete divided by the number arrays begun. In conventional array fabrication processes, yield drops when fabricating high frequency arrays due to the difficulty of handling the smaller (and easier to damage) transducers necessary for the high frequency operation. It is anticipated that the process of the present invention provides high yields under both definitions set forth above, with a projected value of the "begun ratio" of about 0.1 or less. "High throughput" refers to the speed of manufacture; processes that reduce the time for handling and processing thus increase throughput. In conventional fabrication, one labor intensive step is dicing the array, which takes several hours for a conventional array. Further, the process of the present invention produces an array in which the space between respective faces of adjacent transducer elements in the finished array is occupied by air, which has a low acoustic impedance. The finished array thus provides high resolution phased array operation at frequencies in the range 1 MHz to 15 MHz.

Figure 1:
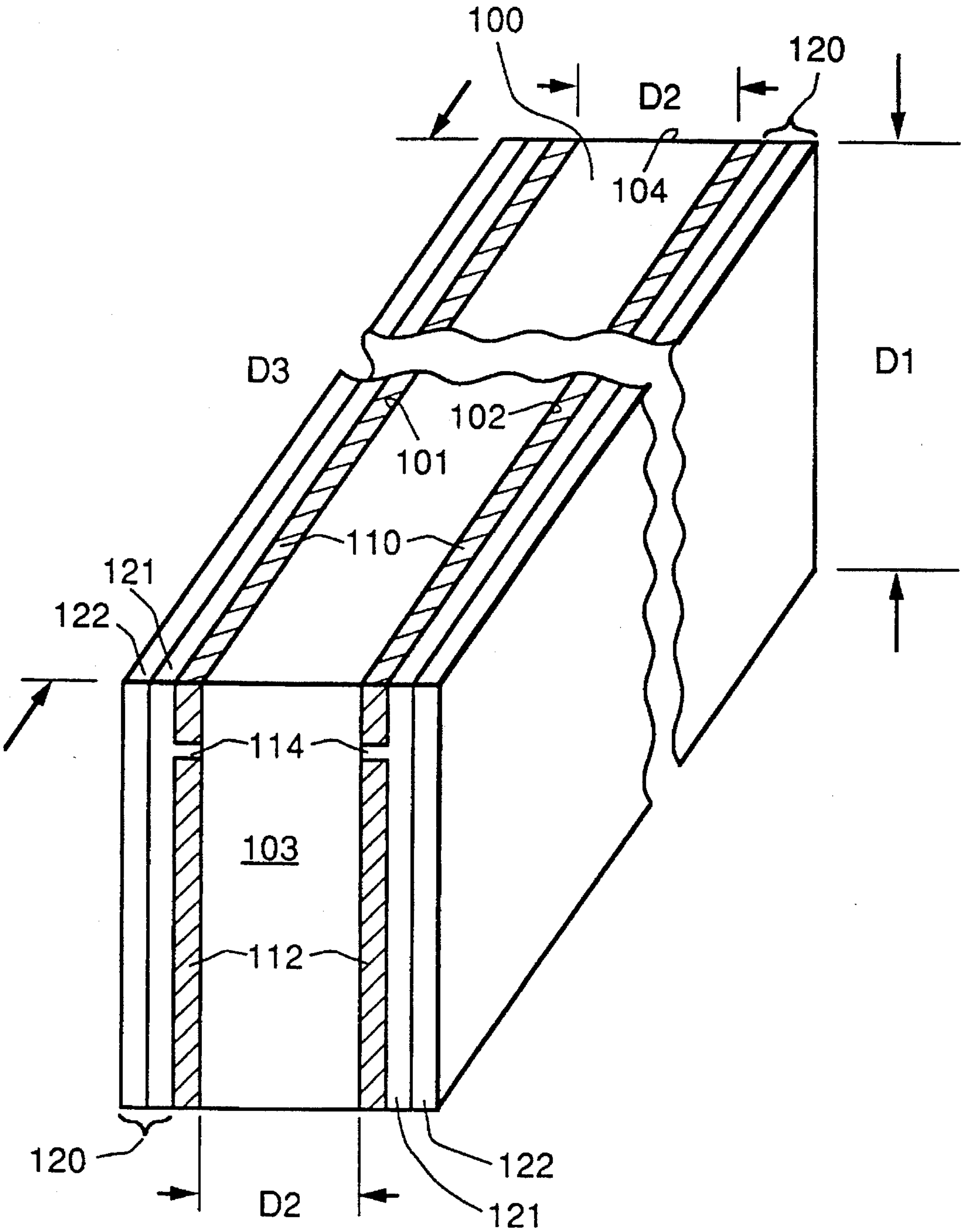
FIG. 1 is an illustration of a piezoelectric ceramic block at one step in the fabrication process of the present invention.

Fabrication of the ultrasound array begins with a ceramic block 100 as illustrated in FIG. 1. Ceramic block 100 comprises a piezoelectric material such as lead zirconate titanate; alternatively a lead based relaxor ferroelectric material such as lead magnesia niobate titanate or lead niobate titanate zirconate, or the like can be used. Such material is typically prepared by conventional processes such as powder pressing and sintering to achieve final densities greater than 99% of that of the ceramic crystalline phase. The dimensions of block 100 are selected such that the block is cut on one of its sides to have a dimension D1 that conforms to the desired width of the finished ultrasound array. Another side of block 100 is cut to a dimension D2 that provides a convenient size for handling in the lamination step described below; dimension D2 is at least twice the desired ultimate thickness of the finished array (that is, the length of the ceramic transducer element between the backing layer and the matching layer of the transducer array) with sufficient additional thickness to allow for waste generated in cutting and for ease of handling. A third dimension D3 of block 100 is selected to provide sufficient bulk of ceramic material to cut a desired number of wafers from the block to form the transducer elements in the array. By way of example and not limitation, ceramic block 100 typically has dimensions on the order of 12 mm (D1)×6 mm (D2)×75 mm–100 mm (D3). Thus, in accordance with this invention, aside from dimension D1, block 100 need not be precisely finished to dimensions that correspond to the dimensions elements used in the final array, but rather can have dimensions that facilitate easy handling and processing during the fabrication.

Figure 2:
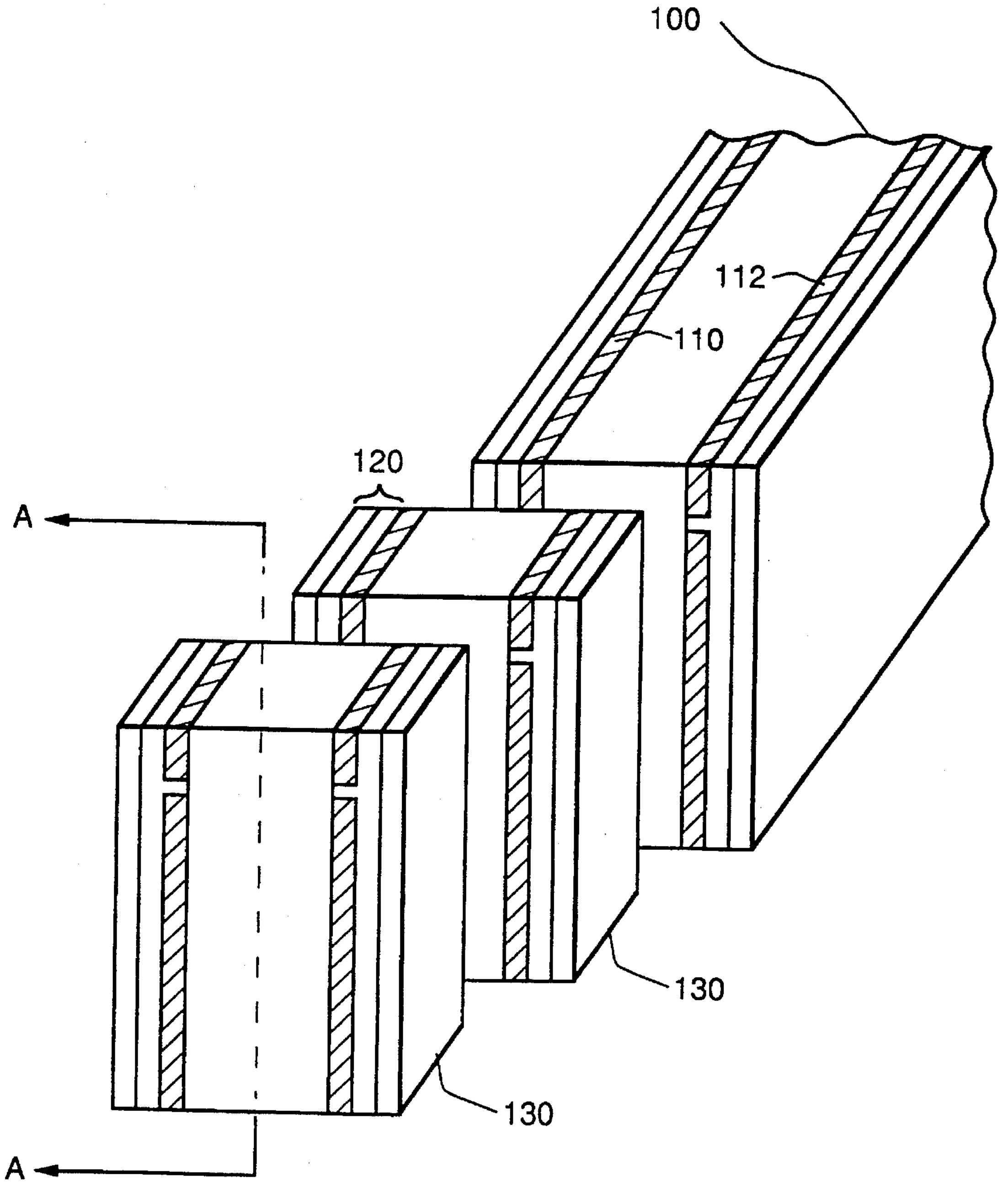
FIG. 2 is an illustration of another step of the present invention in which wafers of piezoelectric material have been cut from the ceramic block.

In the typical fabrication process, electrical contact layers (or electrodes) 110 and 112 are formed on block 100 such that the electrodes are disposed in contact with a first surface 101 and a second surface 102 of block 100. The conductive material used to form electrodes 110, 112 comprises silver or the like applied in a sputtering or evaporative process to a depth in the range between about 1 μm and about 20 μm such that it bonds to the ceramic material of block 100. The conductive material is typically deposited over block 100 to cover at least first and second surfaces 101, 102 and then patterned, such as by etching, to create a gap 114 to electrically isolate the two portions of conductive material that comprise electrodes 110, 112 (the two electrodes being available for use as contacts to the ground plane and signal source driving the transducers in the finished device). By way of example and not limitation, electrodes 110 and 112 are shown in FIGS. 1, 2, and 3 disposed on respective faces 101 and 112 of block 100; in one alternative embodiment, electrodes 110 and 112 are further disposed around a third surface 103 and a fourth surface 104 that are disposed on respective opposite ends of block 100 (in the plane formed by dimension D1 and D2), which arrangement is advantageous if, in the finished device, electrode contact is made to the sides of the transducer elements.

An acoustic matching layer 120 (FIG. 1) is disposed over the portions of electrodes 110 and 112 disposed on first and second surfaces 101, 102 of block 100. Acoustic matching layer typically comprises a first layer 121 and a second layer 122 disposed over first layer 121 to provide optimal acoustic impedance matching between the ceramic material of block 100 and the medium into which the ultrasound energy is to be transmitted during operation of the device. For example, first layer 121 may comprise glass or the like and second layer may comprise a polyimide (e.g., Kapton®) or the like which are bonded together (and to block 100) by an acrylic adhesive or the like. The typical design thickness of acoustic matching layer 120 corresponds to one quarter wavelength of the center frequency in the matching material, for example about 75 μm). In one alternative embodiment, acoustic matching layer 120 may comprise a conductive material, thereby obviating the need for a separate electrical contact layers 110, 112.

Block 100 is next cut (or diced) along a lateral axis A—A (FIG. 2) in plane that is perpendicular to first and second surfaces 101 and 102 so as to form a plurality of wafers 130. The thickness of each wafer (that is, along the axis of dimension D3 of block 100) is in the range between about 75 μm and 150 μm; each wafer will comprise a respective transducer element in the assembled array. The thickness of a wafer (or transducer element) is selected to correspond to one-half the wavelength of the center frequency of the array. Wafers 130 are typically cut with a diamond saw so as to have a smooth surface finish along the plane of the cut. As used herein, "smooth surface finish" and the like refer to a surface having a roughness not greater than about 20 μm (the roughness refers to deviation from a median value of peaks and values in the surface topography) and desirably 10 μm or less. Additionally, in the assembled array the faces of adjacent wafers should be parallel to within less than 10 μm in the direction that sound exits the transducer. In the event a wafer has a non-smooth surface finish, wafers 130 can be polished (by lapping or the like) to provide the desired smooth surface finish.

Figure 3:
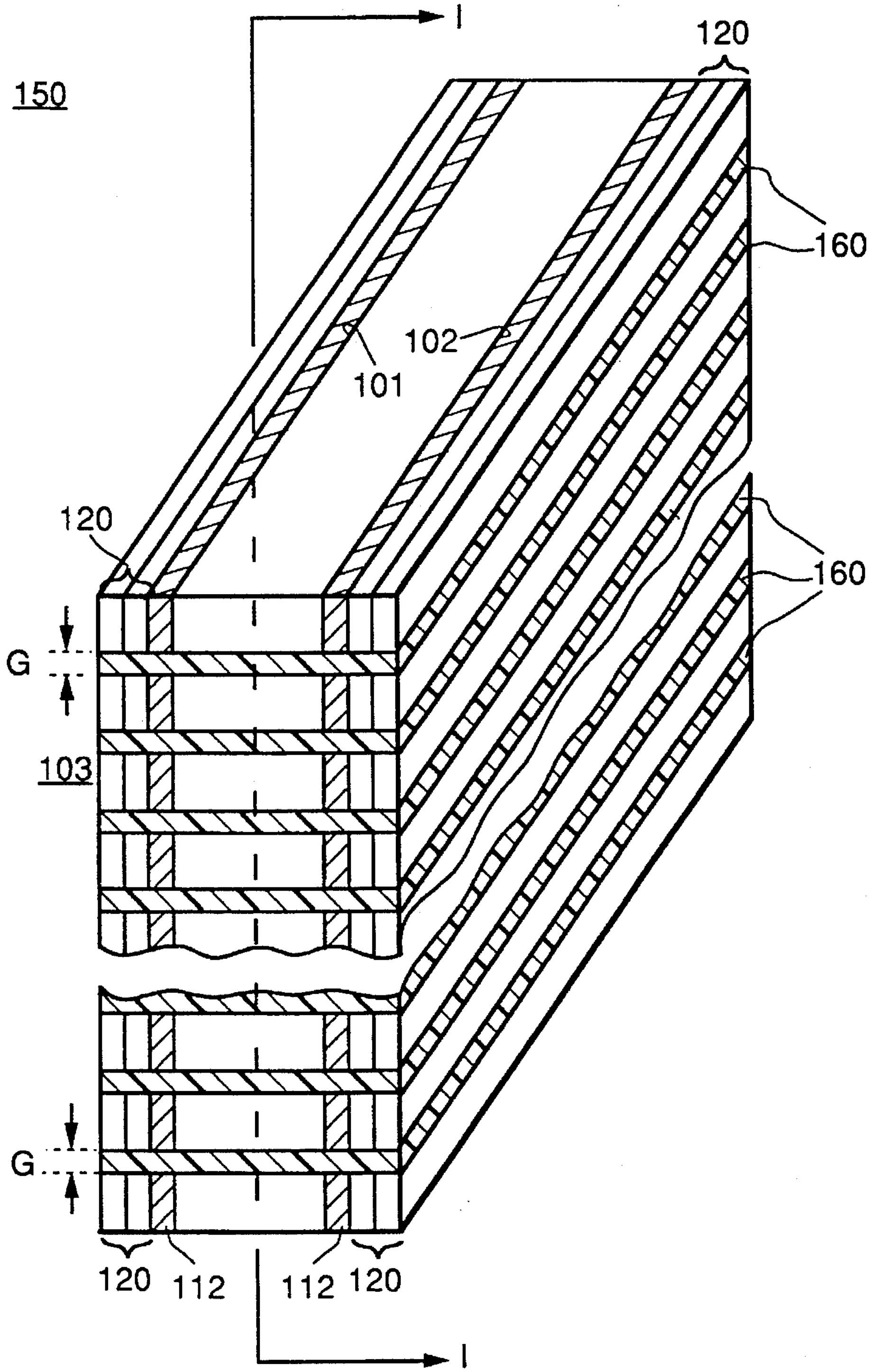
FIG. 3 is an illustration a further step of the present invention showing the laminate body following assembly.

Next, the plurality of wafers 130 are assembled to form a laminated body 150 as illustrated in FIG. 3. Wafers 130 are laminated with a film (or uniform coating) of a polymeric adhesive material 160, aligned, and stacked together such that the respective portions of the acoustic matching layer 120 on each end of respective wafers is aligned with the portions of acoustic matching layer on adjacent wafers. The thickness of polymeric adhesive material layer 160 corresponds to a selected array gap distance "G" (as illustrated in FIG. 3). The selected array gap is typically in the range between about 5 μm and 50 μm, and commonly is small, that is, less than about 25 μm. The gap distance "G" is determined by the thickness of polymeric adhesive 160 applied to the face of respective wafers 130. In an alternative embodiment, shims (or spacers) (not shown) may be disposed on the face of respective wafers 130 prior to assembly into laminate body 150 so as to determine gap distance G. Such shims (or spacers), if used, would have a relatively small area, such as less than about 100 $\mu m^2$. Gap distance G corresponds to the distance between sides (or faces) of respective transducer elements in the finished array. The number of wafers stacked together to form laminate body 150 is selected based upon the size of the ultrasound array that is desired to be fabricated; for example, 64 wafer and 128 wafer size laminate bodies are used in the assembly of ultrasound arrays.

Polymeric adhesive material 160 comprises an adhesive that is removable from the assembled device by vaporization or dissolution in a solvent without damage to the bonds between ceramic block 100 and other components bonded to it, such as matching layer 120, electrodes 110, 112, and the like. For example, polymeric adhesive material 160 typically comprises an polyester coated with an acrylic adhesive, polyurethane, polymethacrylates, cellulosolve acetate, or cellulosic. This type of adhesive material can be applied with excellent uniformity in the desired thickness (so as to provide the desired selected gap distance G between adjacent wafers in laminate body 150). Further, the acrylic-coated polyester is soluble in acetone, a solvent that does not adversely affect the bond between acoustic matching layer 120 and the piezo electric material of block 100 formed with Kapton® polyimide and an acrylic adhesive coating. Alternatively, polymeric adhesive material 160 may comprise a material that vaporizes at temperatures of about 200° C. or less (this temperature being chosen so as to not adversely affect the bond between acoustic matching layer 120 and ceramic block 100 and any intervening layers, such as electrodes 110, 112).

Figure 4:
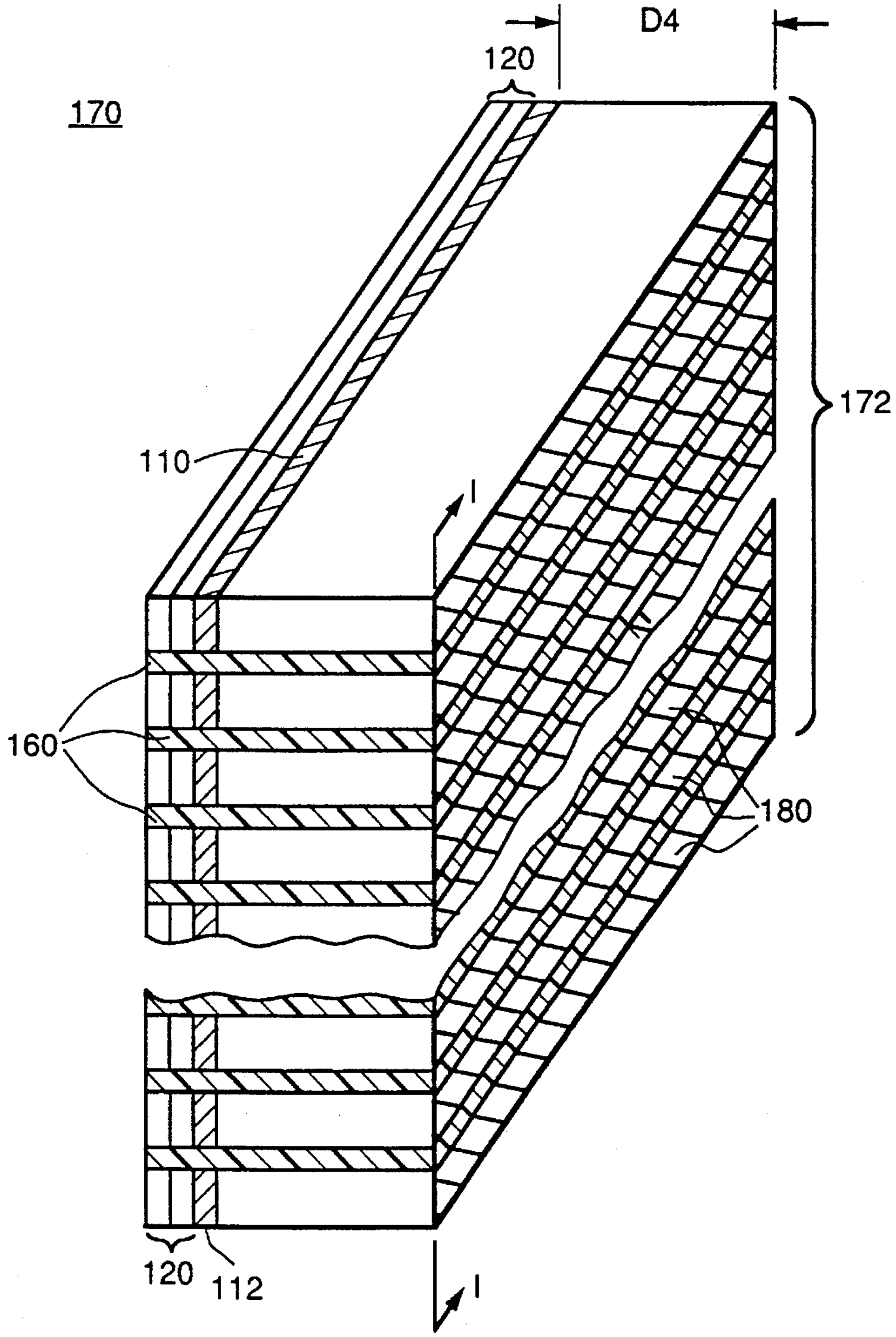
FIG. 4 is an illustration of a still further step of the present invention showing one laminate body subassembly.
Figure 5:
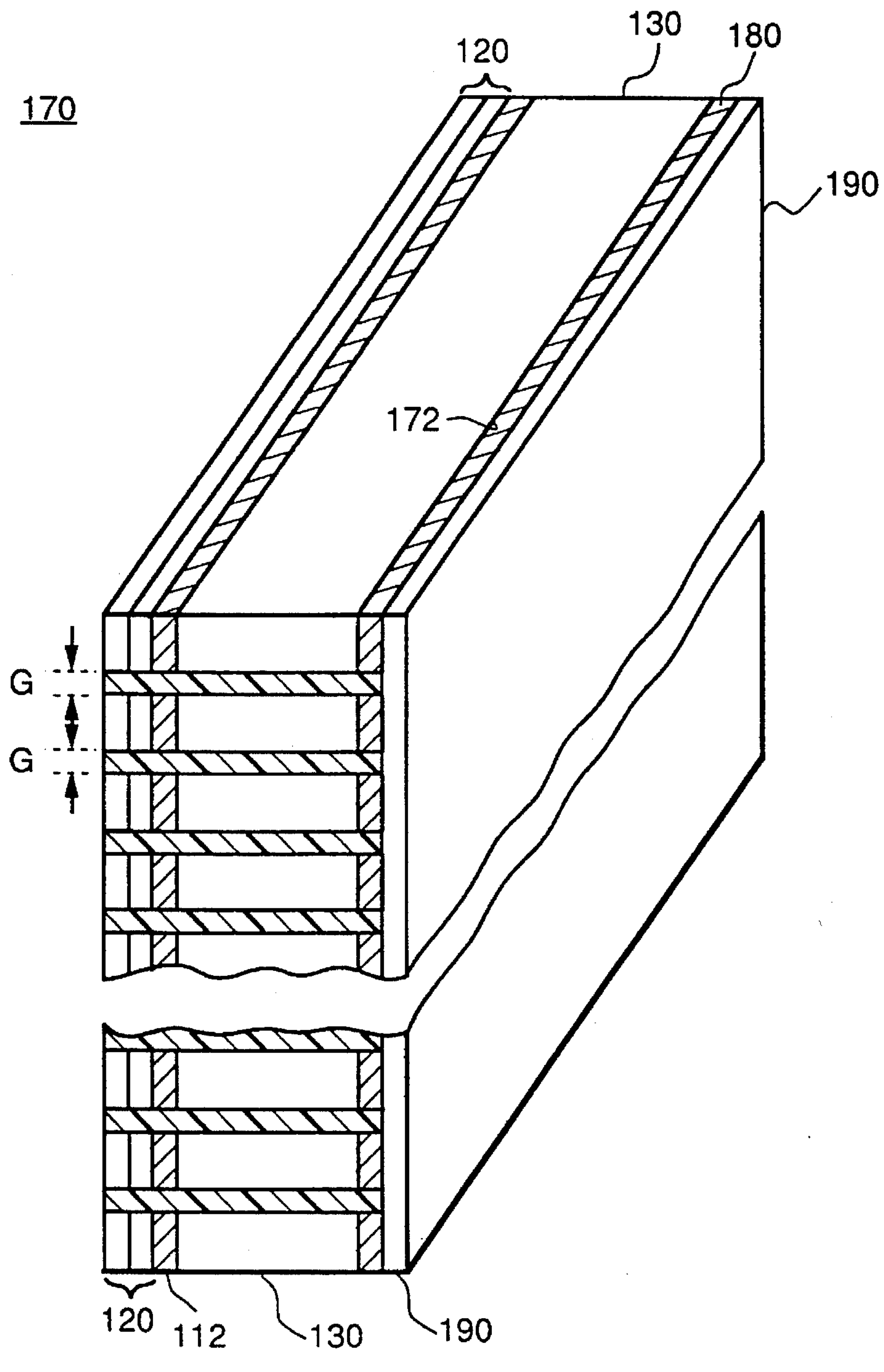
FIG. 5 is an illustration of the ultrasound array at the final step of the present invention.

In accordance with this invention, laminate body 150 is then diced (or cut) into two pieces, the cut being made along the axis I—I as illustrated in FIG. 3 (that is, the cut is made along a plane parallel to the planes of first surface 101 and second surface 102). Cutting of laminate body 150 along axis I—I produces a first laminate body subassembly 170 (FIG. 4) and a second laminate body subassembly (not illustrated in FIG. 4, second laminate body subassembly is in essence a mirror image of first subassembly 170). Typically laminate body 150 is cut in half so that each subassembly has the same thickness between a back (or cut) face (or surface) 172 and the face having the acoustic matching material disposed thereon. The back face of each subassembly is then lapped as necessary to produce a subassembly having a desired thickness, illustrated by dimension D4 in FIG. 4. Typically the thickness (dimension D4) of laminate body subassemblies corresponds to the desired operating frequency of the assembled array in that the desired thickness is about one-half the wavelength of the center frequency of the array. Thicknesses range from about 50 μm and 450 μm; for a high frequency array (about 10 MHz), the thickness is typically in the range between 100 μm and 160 μm.

After laminate body subassemblies have been lapped to the desired thickness a conductive material is deposited on back face 172 of subassembly and the corresponding back face of the second subassembly (not shown) formed when laminate body 150 was cut into two pieces. The conductive material comprises gold or the like, and is typically deposited in a evaporative process to a depth of about 1 μm to about 10 μm. Following deposition of the conductive material on the respective back faces of the laminate body subassemblies, the conductive material is patterned to form a plurality of electrodes 180 such that each electrode is coupled to the ceramic surface (exposed on the back, that is, the cut surface side of each subassembly) of only one wafer 130. Such patterning is typically accomplished using a photolithographic process; alternatively, laser trimming (e.g., ablating the conductive material from selected areas) can be used.

An acoustically absorbing backing layer 190 is then applied to the back face of each laminate body subassembly (over electrodes 180). Backing layer 190 typically comprises a material has a low acoustic absorbance so as to provide high acoustic attenuation (e.g., an attenuation of greater than about 20 dB/cm/MHz). Such materials typically comprise a high Z material disposed in a matrix material having a low Z; one example of such a backing layer material is tungsten-filled rubber. The backing layer serves to absorb sound energy directed into the backing layer so that it does not return to the array and interfere with signals returning from the target. The backing layer material is typically bonded to the back face of the subassembly with an adhesive such as epoxy.

In one alternative embodiment, a conductive adhesive such as a silver-filled epoxy can be used to bond backing layer 190 to back face 172, thereby obviating the necessity of applying a separate conductive material 180 to form the electrodes on the back face (such adhesive still needs to be patterned as described above so that each respective wafer is electrically isolated from other wafers in the subassembly). In a still further embodiment, the backing layer and associated conductive material to form electrode contacts to the back face of the subassembly are fabricated separately (using a process similar to that described above for formation of the subassembly) from the subassembly and then bonded to the subassembly as a single piece.

In accordance with this invention, polymeric adhesive material 160 is removed from the subassembly in a vaporization of dissolution process (as described above). In this process polymeric adhesive material 160 is removed from the space between the faces of the wafers in the subassembly in a process that does not adversely affect the bond between backing layer 190 and the back face of the respective wafers. Further, after removal of polymeric adhesive material from the subassembly, selected array gap G then comprises air, which has a high acoustic impedance (e.g., greater than 0.9). Alternatively, another medium having a desired acoustic impedance (e.g., such as a material having a negative Poisson's ratio) may be disposed between the respective faces of wafers 130 in the space of array gap G.

Each subassembly now comprises a respective ultrasound array that can assembled into an ultrasound device in which electrical contacts can be made to the respective electrodes on the opposite surfaces of the individual wafers 130; typically the electrode disposed under acoustic matching layer 120 comprises the ground electrode, and the electrode under backing layer 190 comprises the signal or drive electrode). The selected array gap G is small, that is, less than 25 μm, enabling the array to be effectively used at high frequencies (e.g., greater than about 7.5 MHz), and the array gap is filled with air, providing excellent acoustic isolation between respective wafers in the array such that there is minimal crosstalk in the array. Further, the surfaces of wafers 130 have a smooth finish, which reduces side lobes and other undesirable acoustic characteristics of the piezoelectric wafer. The process of this invention thus provides a high yield and high throughput method of fabricating high density ultrasound arrays.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A high-yield method of fabricating an ultrasound array having densely packed ultrasound elements with smooth surface finishes, the method comprising the steps of:

applying an acoustic matching material to both a first surface and a second surface of a ceramic block, said first and second surfaces of said block being disposed opposite to one another along a first axis of said block, said block comprising a piezoelectric ceramic material;

cutting said block along a second axis to form a plurality of wafers, said second axis being disposed orthogonal to said first axis such that each wafer cut from said block comprises a portion of said ceramic material extending between said first and second surfaces and the respective associated matching material disposed thereon;

assembling said wafers to form a laminated body, said laminated body comprising a plurality of said wafers disposed to be substantially parallel to one another and such that the respective first and second surfaces and associated matching material disposed thereon of said wafers are aligned, said laminated body further comprising respective layers of a polymeric adhesive material disposed between the parallel faces of said wafers such that said wafers are disposed at a selected array gap distance from immediately adjacent wafers;

cutting said laminated body along a longitudinal axis to form a first laminate body subassembly and a second laminate body subassembly, each of said subassemblies comprising a front surface having said matching material disposed thereon and a back surface comprising a now-exposed face of said ceramic material in each of said wafers and the intermediate portions of said polymeric adhesive material;

applying a backing layer to said back surface of each of said subassemblies; and removing said polymeric adhesive material disposed between respective portions of said ceramic material in each of said first and second subassemblies, whereby each of said subassemblies comprises an ultrasound array wherein said remaining portions of said ceramic wafers with associated matching material disposed on said front surface comprise respective ultrasound elements in said array.

2. The method of claim 1 wherein the step of cutting said laminated body to form first and second subassemblies further comprises lapping each of said subassemblies along their respective back surfaces such that each subassembly has a selected thickness between said back surface and said front surface on which said matching material is disposed, the subassembly thickness being selected to be about one-half the wavelength of the design center frequency of the array.

3. The method of claim 2 wherein each said subassembly thickness is in the range between about about 50 μm and about 450 μm.

4. The method of claim 1 wherein the step of cutting said block along said second axis to form said plurality of wafers further comprises cutting said block such that each wafer has a dimension in the plane perpendicular to the plane of the cut in the range between about 75 μm and 150 μm.

5. The method of claim 4 wherein the step of cutting said block to form said plurality of wafers further comprises smoothing the cut surface on each of said wafers such that each wafer has surface roughness that does not exceed 20 μm from a mean surface reference level.

6. The method of claim 1 wherein said polymeric adhesive material comprises an adhesive selected from the group consisting of polyurethane, polymethacrylates, cellulosolve acetate, and cellulosic.

7. The method of claim 6 wherein the step of assembling said wafers to form said laminated body further comprises the step of establishing said selected array gap by applying said polymeric adhesive material to the face of each wafer to be assembled in an amount corresponding to said selected array gap.

8. The method of claim 7 wherein the step of establishing said selected array gap further comprises disposing shims on the face each wafer to be assembled, said shims having a thickness corresponding to said selected array gap.

9. The method of claim 8 wherein said selected array gap is less than 25 μm.

10. The method of claim 1 wherein the step of removing said polymeric adhesive material further comprises a step selected from the group consisting of: vaporizing said polymeric adhesive material by heating said first and second laminate bodies, and dissolving said polymeric material in a solvent that does not adversely effect the bonds between said ceramic material and other component disposed thereon.

11. The method of claim 1 further comprising the step of depositing a conductive material on said ceramic block such that a conductive layer is disposed in intimate contact with at least said first and second surfaces of said ceramic block.

12. The method of claim 11 wherein said acoustic matching material comprises a conductive material.

13. The method of claim 11 wherein the step of applying a backing layer further comprises forming respective electrode contacts to the respective back surfaces of each wafer in said first and second laminate body subassemblies.

* * * * *